(12) United States Patent
Ishizawa (10) Patent No.: US 7,532,940 B2
(45) Date of Patent: May 12, 2009

(54) TRANSFER MECHANISM AND SEMICONDUCTOR PROCESSING SYSTEM

(75) Inventor: Shigeru Ishizawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 329 days.

(21) Appl. No.: 11/452,212

(22) Filed: Jun. 14, 2006

(65) Prior Publication Data

US 2006/0287761 A1   Dec. 21, 2006

Related U.S. Application Data

(60) Provisional application No. 60/731,285, filed on Oct. 31, 2005.

(30) Foreign Application Priority Data

Jun. 16, 2005 (JP) ............................ 2005-176993

(51) Int. Cl.
  *G05B 19/18* (2006.01)
  *G01P 21/00* (2006.01)
(52) U.S. Cl. ......................................... 700/56; 702/94
(58) Field of Classification Search .................. 700/56; 702/94
  See application file for complete search history.

(56) References Cited

U.S. PATENT DOCUMENTS

| | | | |
|---|---|---|---|
| 5,822,213 A | 10/1998 | Huynh | |
| 6,144,926 A * | 11/2000 | Ishizawa et al. | 702/94 |
| 6,522,942 B2 | 2/2003 | Kondo et al. | |
| 6,605,516 B2 * | 8/2003 | Jost et al. | 438/401 |
| 6,629,053 B1 * | 9/2003 | Mooring | 702/94 |
| 6,950,181 B2 * | 9/2005 | Chen et al. | 356/218 |

FOREIGN PATENT DOCUMENTS

| | | |
|---|---|---|
| JP | 10-223732 | 8/1998 |
| JP | 2001-338969 | 12/2001 |

* cited by examiner

*Primary Examiner*—Thomas H Stevens
(74) *Attorney, Agent, or Firm*—Oblon, Spivak, McClelland, Maier & Neustadt, P.C.

(57) ABSTRACT

A transfer mechanism is used for transferring a target object having a mainly circular contour. The transfer mechanism includes a transfer unit that supplies movements in angular and rectilinear directions to a pick for supporting the target object. An optical sensor is disposed at a standby position on a route of the target object toward a destination, to optically detect presence/absence of the target object on the pick. Angular and rectilinear misalignment amounts of the target object in the angular and rectilinear directions are calculated, with reference to detection and reference values of a signal output from the optical sensor, and at least one of detection and reference values of a radius of the target object. A controller controls the transfer unit to compensate for the angular and rectilinear misalignment amounts in transfer of the target object by the pick.

20 Claims, 8 Drawing Sheets

TRANSFER MECHANISM AND SEMICONDUCTOR PROCESSING SYSTEM

CROSS-REFERENCE TO RELATED APPLICATIONS

This application claims the benefit of U.S. Provisional Application No. 60/731,285, filed Oct. 31, 2005.

This application is based upon and claims the benefit of priority from prior Japanese Patent Application No. 2005-176993, filed Jun. 16, 2005, the entire contents of which are incorporated herein by reference.

BACKGROUND OF THE INVENTION

1. Field of the Invention

The present invention relates to a transfer mechanism for transferring a target object, such as a semiconductor wafer, and a semiconductor processing system employing the transfer mechanism. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an LCD (Liquid Crystal Display) or FPD (Flat Panel Display), by forming semiconductor layers, insulating layers, and conductive layers in predetermined patterns on the target object.

2. Description of the Related Art

In the process of manufacturing semiconductor devices, a semiconductor wafer is subjected to various semiconductor processes, such as film formation, etching, oxidation, diffusion, and so forth. In these processes, owing to the demands of increased miniaturization and integration of semiconductor devices, the throughput and yield involving these processes need to be increased. In light of this, there is a semiconductor processing system of the so-called cluster tool type, which has a plurality of process chambers for performing the same process, or a plurality of process chambers for performing different processes, connected to a common transfer chamber. With this system, various steps can be performed in series, without exposing a wafer to air.

Such a processing system has a transfer unit by which a wafer is automatically transferred from one place to another. The transfer unit has an arm with a pick at the distal end, which is, for example, extendable/retractable, swingable, and movable up and down. The pick directly supports a wafer, and moves horizontally to a transfer position, so that the wafer is transferred to a predetermined place.

It is necessary to prevent the pick and a wafer placed thereon from interfering or colliding with other members, while the transfer unit is moving. It is also necessary for the pick to properly pick up a wafer placed at a certain place, transfer it to a destination, and place it at an appropriate position, with high positional accuracy.

For example, a common transfer chamber is provided with optical sensors at the ceiling or flooring in front of process chambers. The optical sensors are used to detect the presence/absence of a target object on a pick, so as to control the operation of gate valves disposed between the common transfer chamber and the respective process chambers.

Jpn. Pat. Appln. KOKAI Publication No. 10-223732 (Patent Document 1) discloses an example of the processing systems of this kind. In this system, an optical sensor is disposed near the entrance of a specific one of the process chambers. The optical sensor is used to detect whether a pick supports a target object with sufficient positional accuracy.

Jpn. Pat. Appln. KOKAI Publication No. 2001-338969 (Patent Document 2) discloses another example of the processing systems of this kind. In this system, a common transfer chamber is provided with a line sensor, while a transfer unit is provided with a wing. The line sensor is used to detect the positional relationship of a target object relative to the wing, so as to detect whether a pick supports the target object with sufficient positional accuracy. If certain positional misalignment is found, the transfer unit is controlled in operation to compensate for the positional misalignment amount.

However, the conventional mechanism for detecting positional misalignment of a target object requires not only an optical sensor for detecting the presence/absence of a target object on a pick, but also an optical sensor for detecting the amount of positional misalignment of the target object. Accordingly, the mechanism for detecting positional misalignment of a target object increases the initial cost of the system. Further, sometimes it may be necessary to dispose an optical sensor or line sensor at a position deviated from the transfer route of a target object. In this case, when detection of positional misalignment of the target object is performed, the target object has to be transferred through the position deviated from the transfer route. This increases the transfer time period of the target object, and thus decreases the throughput.

Furthermore, for example, in the case of a wafer (target object) of 300 mm or 200 mm, the diameter thereof is required to have a high dimensional accuracy of ±0.2 mm. Under the circumstances, a strict design rule tends to be applied to transfer of target objects, such that the transfer positional accuracy is set to be within a range of ±0.2 mm. However, the diameter of target objects may fluctuate within a range of ±0.2 mm, as described above. This fluctuation in the diameter of target objects due to individual difference can affect the positional accuracy in transfer of target objects.

BRIEF SUMMARY OF THE INVENTION

An object of the present invention is to provide a transfer mechanism and semiconductor processing system, which have a simple structure for detecting a positional misalignment amount of a target object on a pick.

Another object of the present invention is to provide a transfer mechanism and semiconductor processing system, which can detect a positional misalignment amount of a target object on a pick, without being affected by fluctuation in the diameter of target objects due to individual difference.

According to a first aspect of the present invention, there is provided a transfer mechanism for transferring a target object having a mainly circular contour, the mechanism comprising:

a transfer unit including a pick at a distal end for supporting the target object, and configured to supply movements to the pick in an angular direction and a rectilinear direction;

an optical sensor disposed at a standby position on a route of the target object toward a destination, and configured to optically detect presence/absence of the target object on the pick;

an output detecting section configured to detect a signal output from the optical sensor, when the pick supporting the target object is supplied with movements in the angular direction and the rectilinear direction at the standby position;

an arithmetic section configured to calculate an angular misalignment amount of the target object in the angular direction and a rectilinear misalignment amount of the target object in the rectilinear direction, with reference to a detection value of the signal obtained by the output detecting section, a reference value of the signal, and at least one of a detection value and a reference value of a radius of the target object based on the circular contour; and a controller configured to control the transfer unit to compensate for the angular misalignment amount and the rectilinear misalignment amount, when the pick is operated to transfer the target object to the destination.

According to a second aspect of the present invention, there is provided a semiconductor processing system for processing a target object having a mainly circular contour, the system comprising:

a pressure-adjustable common transfer chamber having a plurality of side surfaces;

pressure-adjustable first and second process chambers connected to two of the plurality of side surfaces and each configured to perform a semiconductor process on a target object;

a transfer unit disposed inside the common transfer chamber to transfer the target object into and from the first and second process chambers, the transfer unit including a pick at a distal end for supporting the target object, and configured to supply movements to the pick in an angular direction and a rectilinear direction;

an optical sensor disposed at a standby position, which is preset inside the common transfer process chamber and in front of each of the first and second process chambers, and configured to optically detect presence/absence of the target object on the pick;

an output detecting section configured to detect a signal output from the optical sensor, when the pick supporting the target object is supplied with movements in the angular direction and the rectilinear direction at the standby position;

an arithmetic section configured to calculate an angular misalignment amount of the target object in the angular direction and a rectilinear misalignment amount of the target object in the rectilinear direction, with reference to a detection value of the signal obtained by the output detecting section, a reference value of the signal, and at least one of a detection value and a reference value of a radius of the target object based on the circular contour; and a controller configured to control the transfer unit to compensate for the angular misalignment amount and the rectilinear misalignment amount, when the pick is operated to transfer the target object to a corresponding one of the first and second process chambers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will now be described with reference to the accompanying drawings. In the following description, the constituent elements having substantially the same function and arrangement are denoted by the same reference numerals, and a repetitive description will be given only when necessary.

Figure 1:
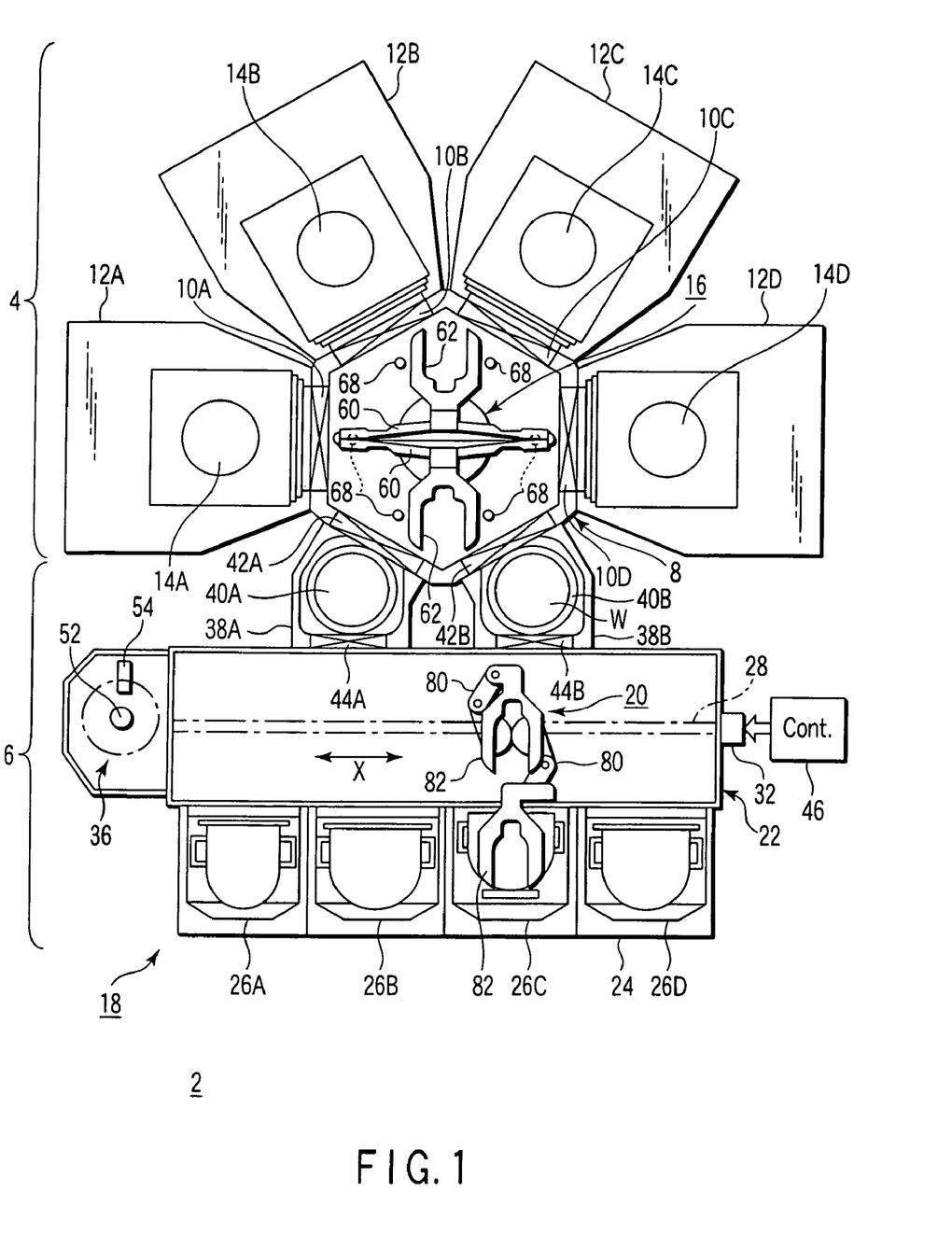
FIG. 1 is a structural view schematically showing a semiconductor processing system according to an embodiment of the present invention.

FIG. 1 is a structural view schematically showing a semiconductor processing system according to an embodiment of the present invention. At first, an explanation will be given of a processing system of the cluster tool type with reference to FIG. 1. This processing system 2 is arranged to process a target object W having a mainly circular contour, such as a semiconductor wafer. The processing system 2 is mainly formed of a processing section 4 arranged to perform various processes, such as film formation process, diffusion process, and etching process, and a loader section 6 arranged to load and unload a target object (which may be referred to as a wafer, hereinafter) to and from the processing section 4.

As shown in FIG. 1, the processing section 4 includes a common transfer chamber 8 having an essentially hexagonal shape and four process chambers 12A, 12B, 12C, and 12D. The loader section 6 includes a cassette stage 18 for placing wafer cassettes thereon and a laterally long loader transfer chamber 22. The processing section 4 is connected to the loader section 6 through first and second load-lock chambers 38A and 38B. The common transfer chamber 8 and first and second load-lock chambers 38A and 38B are each formed of an airtight chamber, which can be vacuum-exhausted.

Specifically, the process chambers 12A to 12D are respectively connected to four sidewalls of the common transfer chamber 8 having an essentially hexagonal shape, and the first and second load-lock chambers 38A and 38B are respectively connected to the other two sidewalls. In other words, the processing system 2 has a structure of the cluster tool type, in which the process chambers and load-lock chambers are disposed around and connected to the common transfer chamber 8. The first and second load-lock chambers 38A and 38B are connected to the loader transfer chamber 22 in common. The process chambers 12A to 12D and first and second load-lock chambers 38A and 38B are connected to the common transfer chamber 8, respectively through gate valves 10A to 10D, and 42A and 42B, which can be opened and airtightly closed. The first and second load-lock chambers 38A and 38B are connected to the loader transfer chamber 22, respectively through gate valves 44A and 44B, which can be opened and airtightly closed.

The four process chambers 12A to 12D are designed to perform processes of the same kind or different kinds on a target object or semiconductor wafer W in a vacuum atmosphere. The process chambers 12A to 12D are respectively provided with susceptors 14A to 14D therein, for placing a wafer thereon. The first and second load-lock chambers 38A and 38B are respectively provided with tables 40A and 40B therein, for temporarily placing a wafer thereon.

A first transfer unit 16 is disposed at the center in the common transfer chamber 8, where it can access each of the two load-lock chambers 38A and 38B and four process chambers 12A to 12D. The first transfer unit 16 has two transfer arms 60, each of which is formed of an articulated arm and is extendable/retractable, swingable, and movable up and down, so that the first transfer unit 16 can handle two wafers at one time. The transfer arms 60 respectively have bifurcated picks 62 at their distal ends and are extendable/retractable toward opposite directions independently of each other. The first transfer unit 16 is used to transfer wafers W among the process chambers 12A to 12D and load-lock chambers 38A and 38B. The first transfer unit 16 may be designed to have only one pick. The entirety of a transfer mechanism associated with the transfer unit 16 will be explained later in detail.

The loader transfer chamber 22 is formed of a laterally long casing. On one side of this laterally long casing, one or more, e.g., four in this embodiment, ports are formed, for transferring target objects or semiconductor wafers W thereinto and therefrom. The ports are respectively provided with cassette tables 24 in the cassette stage 18. Each of the cassette tables 24 is structured to place one of wafer cassettes 26A to 26D thereon. Each of the cassettes 26A to 26D can accommodate a plurality of, e.g., 25, wafers with regular intervals therebetween in the vertical direction.

In the loader transfer chamber 22, there is a second transfer unit 20 for transferring wafers W in the longitudinal direction of the chamber 22. The second transfer unit 20 is slidably supported on a guide rail 28 extending in the longitudinal direction of the loader transfer chamber 22 at the center. A drive mechanism, such as a ball screw (not shown), is disposed beside the guide rail 28, and engages with the base of the second transfer unit 20 is. When a drive motor 32 disposed at the end of the ball screw is rotated, the second transfer unit 20 is moved on the guide rail 28 in an X direction.

The second transfer unit 20 has two articulated transfer arms 80 disposed at two height levels. The transfer arms 80 are respectively provided with bifurcated picks 82 at the end, on which a wafer W is directly placed. The transfer arms 80 are extendable/retractable in a radial direction from the center, and can be independently controlled to perform an extending/retracting action. The transfer arms 80 have rotational shafts coaxially and rotatably connected to the base, and can be rotated together relative to the base. The second transfer unit 20 is used to transfer wafers W among the wafer cassettes 26A to 26D, load-lock chambers 38A and 38B, and orientor 36 described below.

Figure 2:
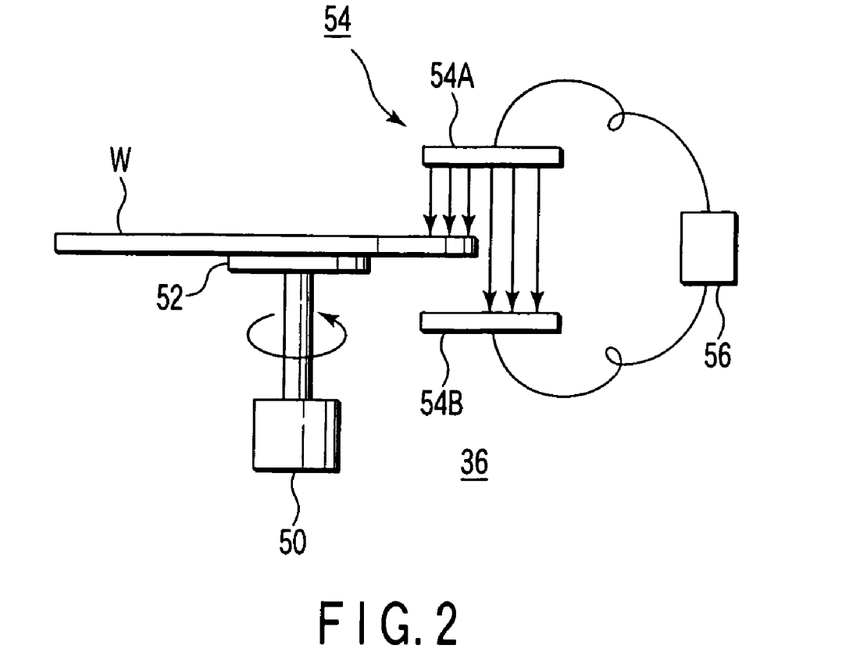
FIG. 2 is a side view showing an orientor (alignment unit) used in the processing system shown in FIG. 1.
Figure 3:
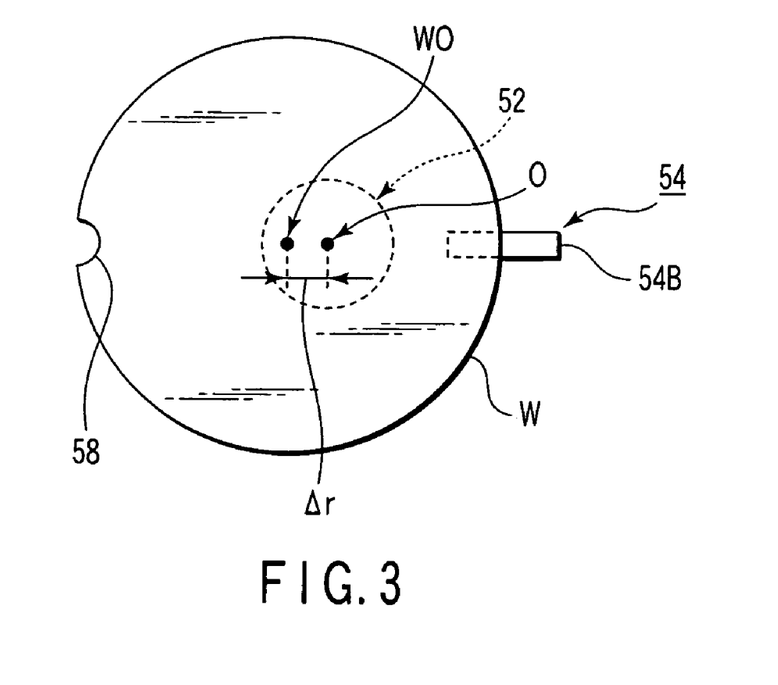
FIG. 3 is a plan view showing the orientor shown in FIG. 2, with a target object placed thereon.

The orientor 36 is disposed at an end of the loader transfer chamber 22 and is used as an alignment mechanism for performing alignment of a wafer W. FIG. 2 is a side view showing the orientor 36. FIG. 3 is a plan view showing the orientor 36 with a wafer W placed thereon. The orientor 36 includes a rotary table 52, which is rotated by a drive motor 50, along with the wafer W placed thereon. An optical sensor 54 is disposed around the rotary table 52, to detect the peripheral edge of the wafer W. The optical sensor 54 includes a linear light-emitting element 54A and a light-receiving element 54B. The linear light-emitting element 54A has a predetermined length and extends in the radial direction of the rotary table 52. The light-receiving element 54B is disposed to face the linear light-emitting element 54A with the wafer peripheral edge interposed therebetween. The optical sensor 54 radiates a curtain leaser beam L onto the wafer edge to detect changes therein.

A main control section 46 (see FIG. 1) formed of, e.g., a microcomputer is arranged to control the operation of the processing system 2 as a whole. Information obtained at the respective portions of the processing system 2 is processed by an information processing section disposed in the main control section 46. Further, the main control section 46 includes output detecting sections, arithmetic sections, and storage sections described later as parts built therein.

Figure 4:
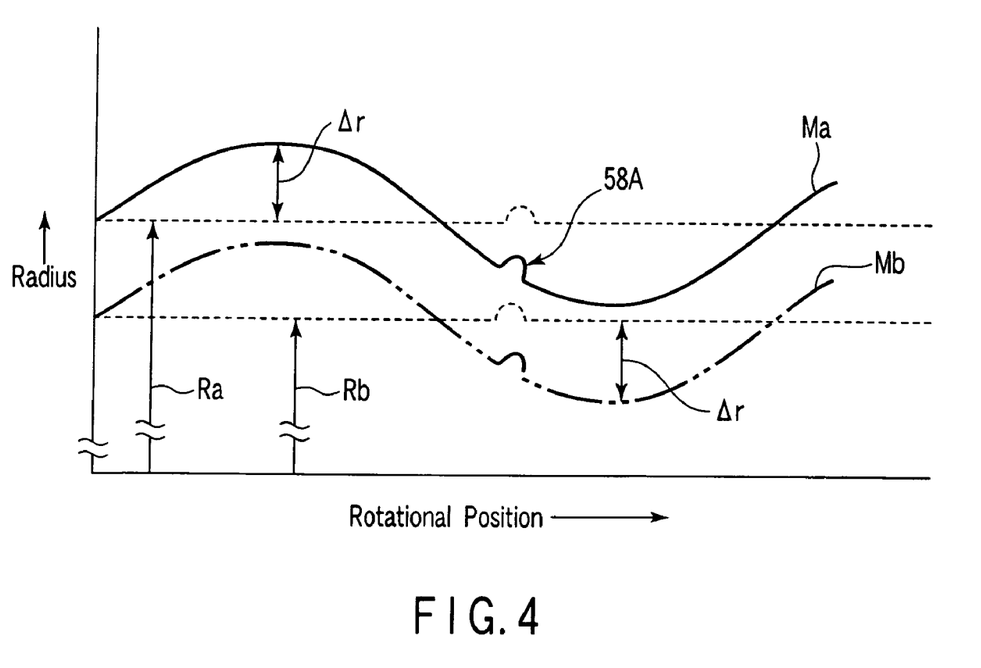
FIG. 4 is a view showing a detection waveform obtained by the orientor shown in FIG. 2.

FIG. 4 is a view showing a detection waveform obtained by the optical sensor 54 of the orientor 36. Signals detected by the optical sensor 54 are transmitted to an arithmetic section 56. The arithmetic section 56 is arranged to calculate, on the basis of the detect signals, the amount and direction of misalignment of a wafer W, the position of the cut mark, such as a notch or orientation flat, of the wafer W, i.e., the orientation of the wafer W, and the radius R of the wafer W.

In FIG. 3, "O" denotes the center of the rotary table 52 (rotational center), "W0" denotes the center of the wafer W, and thus "$\Delta r$" denotes a misalignment amount. Each of the waveforms shown in FIG. 4 is a sine curve with an amplitude corresponding to $\Delta r$. The mean value of the sine curve represents the radius R of the wafer W. The misalignment direction corresponds to a rotational position where the amplitude takes on the minimum value. If the misalignment amount $\Delta r$ is zero, the output waveform becomes linear except for the portion corresponding to the notch 58. At the portion corresponding to the notch 58, a signal 58A appears to show the rotational position of the notch 58. These matters are used to detect misalignment in the rotational position from a preset reference position to the notch 58. FIG. 4 shows the output waveforms Ma and Mb and radiuses Ra and Rb of two target objects. The cut mark is formed of a notch in 12-inch wafers, while it is formed of a notch or orientation flat in 8-inch and 6-inch wafers.

Figure 5:
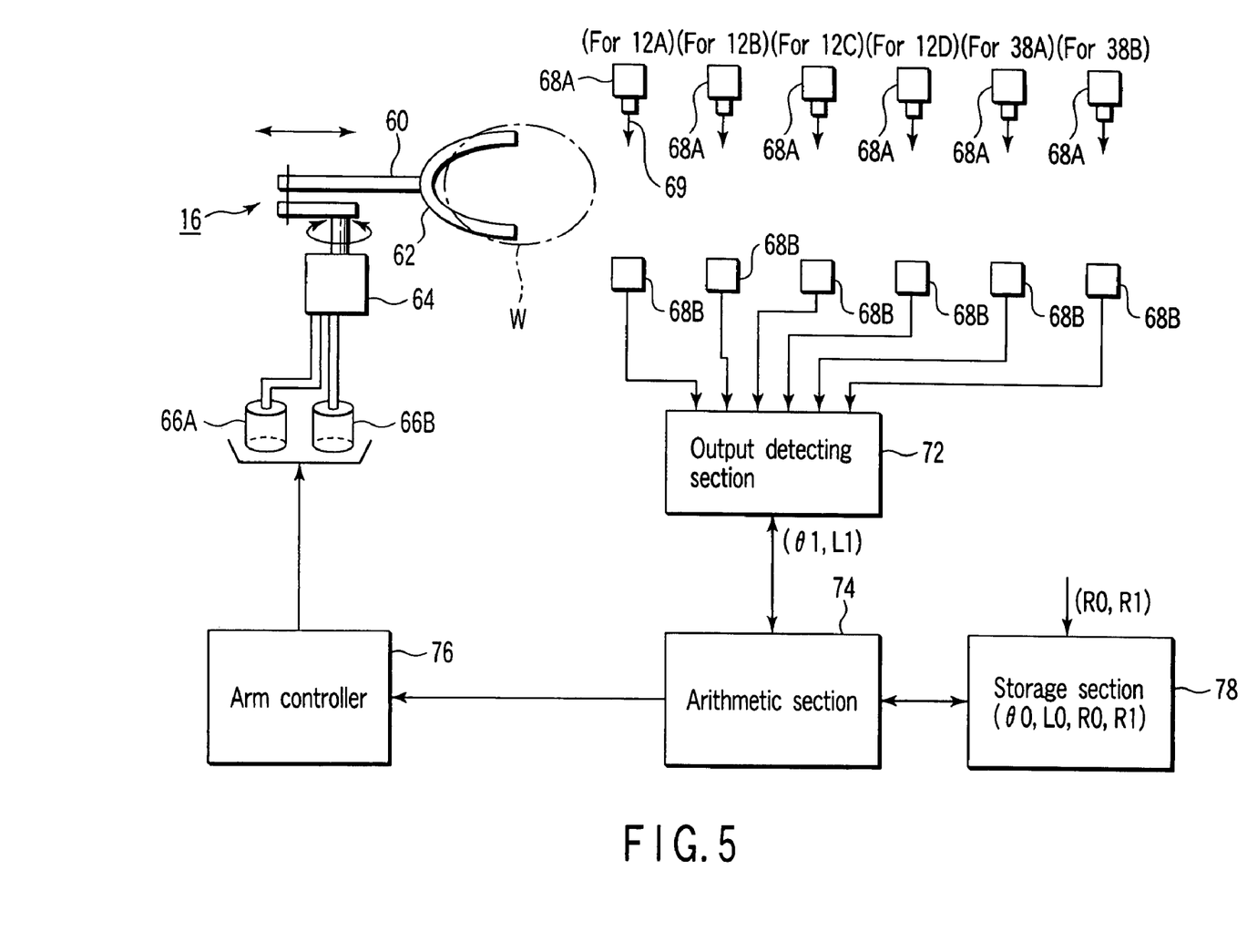
FIG. 5 is a structural view schematically showing the entirety of a transfer mechanism associated with a transfer unit disposed in the common transfer chamber of the processing system shown in FIG. 1.
Figure 6:
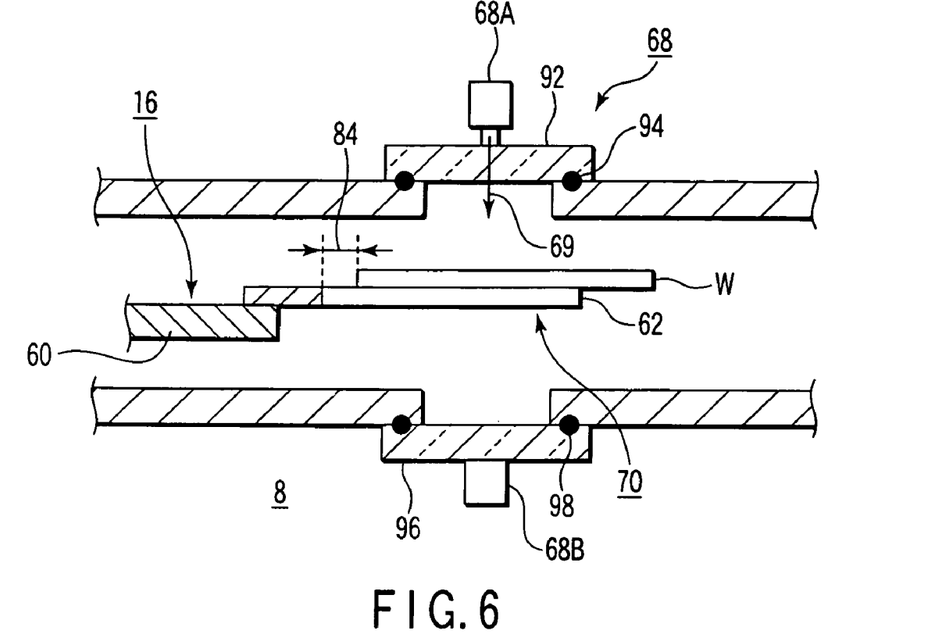
FIG. 6 is a sectional view showing the positional relationship between the pick of a transfer arm and an optical sensor at a standby position in the transfer mechanism shown in FIG. 5.
Figure 7:
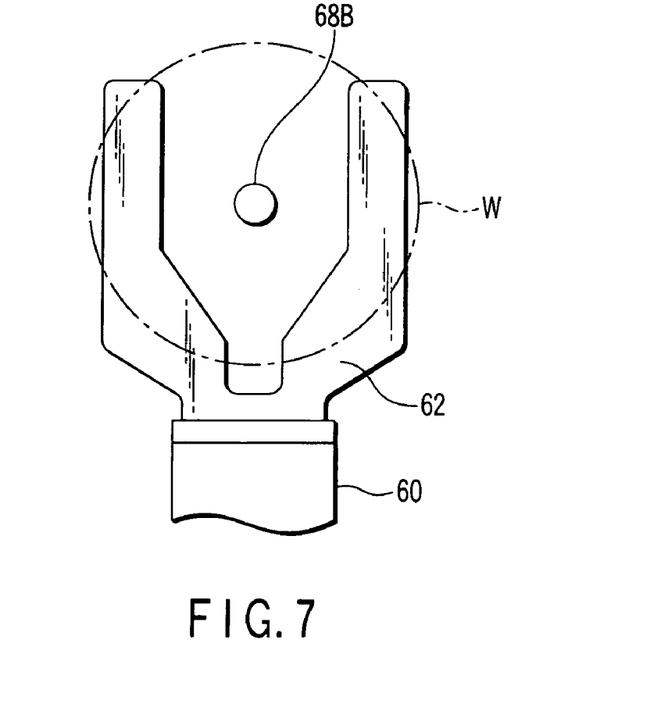
FIG. 7 is a plan view showing the positional relationship between the pick of a transfer arm and an optical sensor at a standby position in the transfer mechanism shown in FIG. 5.

Next, a detailed explanation will be given of the entirety of a transfer mechanism associated with the first transfer unit 16 disposed in the common transfer chamber 8. This explanation will be made taking one of the transfer arms 60 of the first transfer unit 16 as an example. FIG. 5 is a structural view schematically showing the entirety of a transfer mechanism associated with the first transfer unit 16. FIG. 6 is a sectional view showing the positional relationship between the pick 62 of one transfer arm 60 and the optical sensor 68. FIG. 7 is a plan view showing the positional relationship between the pick 62 of one transfer arm 60 and the optical sensor 68.

As shown in FIG. 5, for example, the transfer arm 60 is extendable/retractable and swingable, and is supported by a coaxial rotational shaft portion 64 that includes two shafts coaxially and rotatably disposed. The transfer arm 60 is extended and retracted by bi-directional rotation of a dedicated motor 66A. Further, the transfer arm 60 is swung by bi-directional rotation of a dedicated motor 66B. The bifurcated pick 62 is attached at the distal end of the transfer arm 60, as described above.

The common transfer chamber 8 has standby positions 70 (see FIG. 6) preset therein for temporarily stopping a wafer W (pick 62), in front of the process chambers 12A to 12D and load-lock chambers 38A and 38B (i.e., six positions), respectively. Six optical sensors 68, each of which detects the presence/absence of a wafer W, are respectively disposed at the standby positions 70. In other words, each of the standby positions 70 is preset on the transfer route of a wafer W. The transfer arm 60 is extended from the standby position 70 to deliver a wafer W into a process chamber or load-lock chamber.

FIG. 6 shows one of the optical sensors 68. As shown in FIG. 6, each optical sensor 68 has a light-emitting element 68A and a light-receiving element 68B (see also FIG. 7) respectively disposed above and below each standby position 70 for temporarily stopping a wafer W. Specifically, the ceiling of the common transfer chamber 6 has a window 92 made of, e.g., quartz glass and airtightly mounted by a seal member 94, such as an O-ring. The light-emitting element 68A is disposed above the window 92. Opposite to this portion of the ceiling, the flooring has a window 96 made of, e.g., quartz glass and airtightly mounted by a seal member 98, such as an O-ring. The light-receiving element 68B is disposed below the window 98. The light-emitting element 68A is formed of, e.g., a laser light-emitting element or LED element. A checkout light 69 is emitted from the light-emitting element 68A and received by the light-receiving element 68B, to detect the presence/absence of the pick 62 and wafer W. It may be arranged such that the light-receiving element 68B is disposed above the ceiling and the light-emitting element 68A is disposed below the flooring. As described above, the six optical sensors 68 are respectively disposed in front of the process chambers and load-lock chambers, as shown in FIGS. 1 and 5.

The signal output from each optical sensor 68 is detected by an output detecting section 72. Detection values of the signal obtained by the output detecting section 72 are transmitted to an arithmetic section 74. The arithmetic section 74 calculates an angular misalignment amount in an angular direction and a rectilinear misalignment amount in a rectilinear direction for each wafer W, with reference to a detection value of the signal and a reference value of the signal. Further, at this time, the arithmetic section 74 refers to at least one of, and preferably both of, a detection value and a reference value of the radius of the wafer W based on its circular contour. The arithmetic section 74 is connected to a storage section 78 that stores data necessary for the arithmetic process, such as reference values and detection values of the signal and radius described above.

The angular misalignment amount and rectilinear misalignment amount calculated by the arithmetic section 74 are transmitted to an arm controller 76. When the transfer unit 16 is used to transfer the wafer W to a destination by the pick 62, the arm controller 76 controls the transfer arm 60 in operation to compensate for the angular misalignment amount and rectilinear misalignment amount. Further, the arm controller 76 stops the operation of the transfer arm 60 when a detection value of the presence/absence of the wafer W on the pick 62 does not meet a preset status value indicative of the presence/absence of the wafer W.

The reference value of the signal output from each optical sensor 68 includes an angular reference value set in an angular direction of a wafer W and a rectilinear reference value set in a rectilinear direction of the wafer W. These reference values are preset by a teaching operation and stored in the storage section 78. The angular reference value and rectilinear reference value will be described later. The output detecting section 72, arithmetic section 74, arm controller 76, and storage section 78 are arranged as parts of one computer, such as the main control section 46.

Next, an explanation will be given of a method for transferring a wafer W, performed in the processing system 2 described above. This explanation will be made taking one of the transfer arms 60 of the first transfer unit 16 as an example. However, each of the two transfer arms 60 individually undergoes the following teaching operation, calculation of misalignment amounts, and operational control.

At first, before an actual transfer operation of a wafer W is started, a teaching operation is performed to teach reference positions (stop positions), i.e., coordinate positions of the start point and end point of the operation, to each of the first and second transfer units 16 and 20. For example, as regards the first transfer unit 16, a wafer W (reference target object) is properly placed on each pick 62 of the first transfer unit 16 with high positional accuracy by, e.g., manual handling. Further, the coordinate of a stop position of the pick 62 at the standby position 70 (see FIG. 6) having the optical sensor 68 is set as a stop reference position. Consequently, the pick 62 of the transfer arm 60 can accurately stop at this stop reference position and start an operation from this stop reference position used as a start point.

Then, the transfer arm 60 is automatically moved in an angular direction and a rectilinear direction, while using this stop reference position as a start point or end point. During this movement, an angular reference value and a rectilinear reference value are obtained by the optical sensor 68 and are stored in the storage section 78 (see FIG. 5). At this time, the reference values are obtained as follows, which will be explained with reference to FIGS. 8A to 12.

Figure 8A:
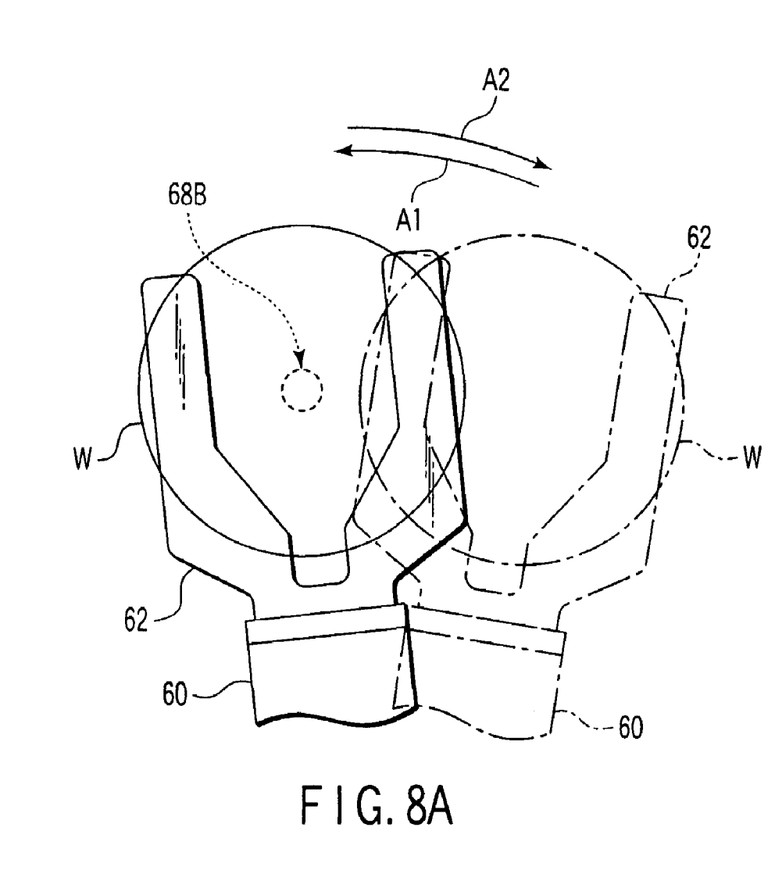
FIG. 8A is a plan view showing the positional relationship between the pick of a transfer arm and a light-receiving element when the pick is moved in an angular direction at the standby position shown in FIG. 7.
Figure 8B:
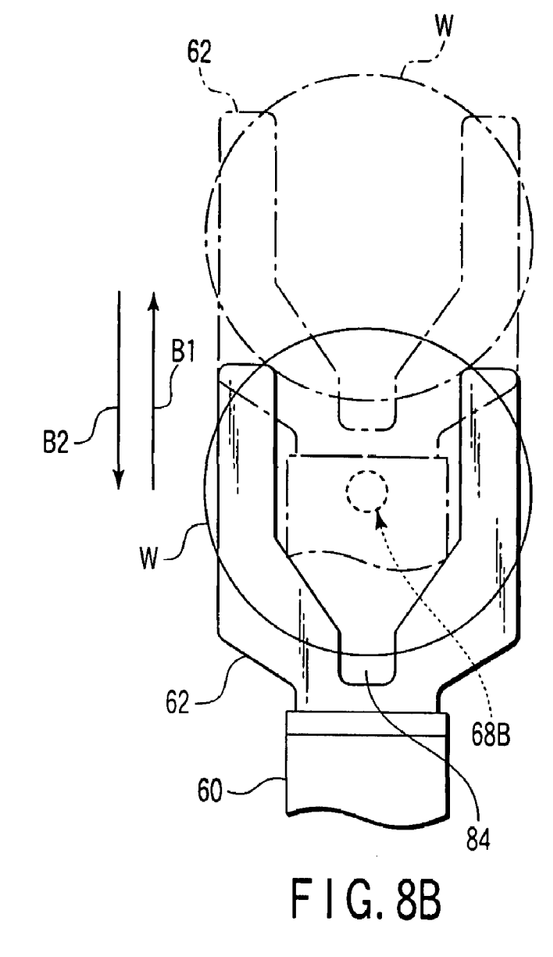
FIG. 8B is a plan view showing the positional relationship between the pick of a transfer arm and the light-receiving element when the pick is moved in a rectilinear direction at the standby position shown in FIG. 7.
Figure 9:
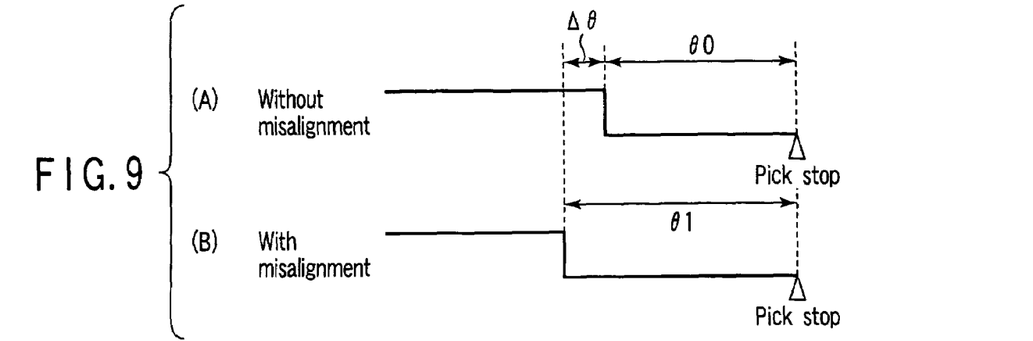
FIG. 9 is a view showing the output of the light-receiving element (ON/OFF) when the pick of a transfer arm is moved in an angular direction indicated by an arrow A1 in FIG. 8A.
Figure 10:
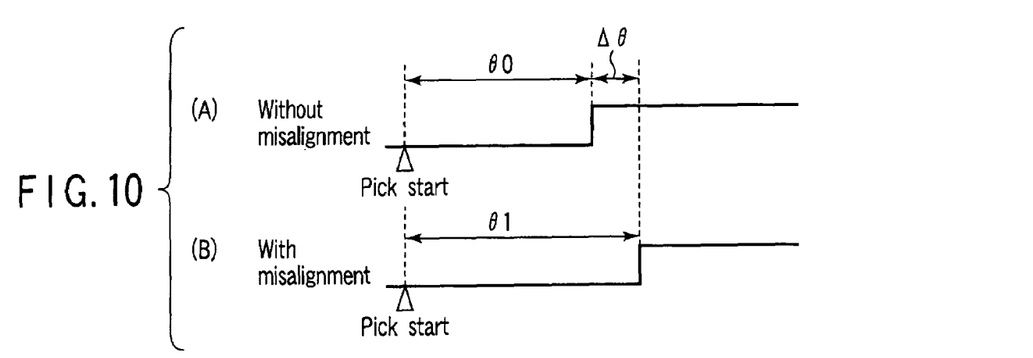
FIG. 10 is a view showing the output of the light-receiving element (ON/OFF) when the pick of a transfer arm is moved in an angular direction indicated by an arrow A2 in FIG. 8A.
Figure 11:
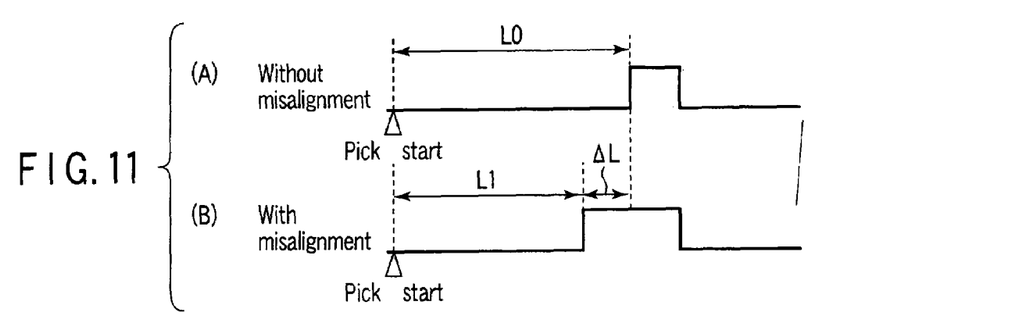
FIG. 11 is a view showing the output of the light-receiving element (ON/OFF) when the pick of a transfer arm is moved in a rectilinear direction indicated by an arrow B1 in FIG. 8B.
Figure 12:
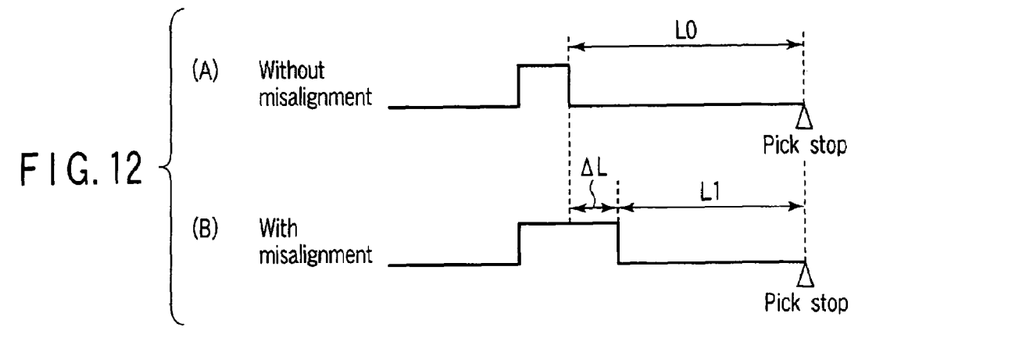
FIG. 12 is a view showing the output of the light-receiving element (ON/OFF) when the pick of a transfer arm is moved in a rectilinear direction indicated by an arrow B2 in FIG. 8B.

FIG. 8A is a plan view showing the positional relationship between the pick 62 of the transfer arm 60 and the light-receiving element 68B when the pick 62 is moved in an angular direction at the standby position 70 shown in FIG. 7. FIG. 8B is a plan view showing the positional relationship between the pick 62 of the transfer arm 60 and the light-receiving element 68B when the pick 62 is moved in a rectilinear direction at the standby position 70 shown in FIG. 7. FIG. 9 is a view showing the output of the light-receiving element 68B (ON/OFF) when the pick 62 of the transfer arm 60 is moved in an angular direction indicated by an arrow A1 in FIG. 8A. FIG. 10 is a view showing the output of the light-receiving element 68B (ON/OFF) when the pick 62 of the transfer arm 60 is moved in an angular direction indicated by an arrow A2 in FIG. 8A. FIG. 11 is a view showing the output of the light-receiving element 68B (ON/OFF) when the pick 62 of the transfer arm 60 is moved in a rectilinear direction indicated by an arrow B1 in FIG. 8B. FIG. 12 is a view showing the output of the light-receiving element 68B (ON/OFF) when the pick 62 of the transfer arm 60 is moved in a rectilinear direction indicated by an arrow B2 in FIG. 8B. In each of FIGS. 9 to 12, (A) shows an output pattern obtained when a wafer W is in a state of "without misalignment", i.e., when a teaching operation is performed to obtain a reference value, using a wafer W (reference target object). On the other hand, (B) shows an output pattern obtained when a wafer W is in a state of "with misalignment", i.e., when a product wafer is actually transferred.

FIG. 9, (A), shows a case where the pick 62 is swung in a direction indicated by the arrow A1 in FIG. 8A, from a position shown with a chain line to the standby position shown with a solid line. At this time, communication and shutoff of the checkout light 69 (see FIG. 6) from the light-emitting element 68A to the light-receiving element 68B are switched by the wafer W supported on the pick 62 with high positional accuracy for the teaching operation. Based on this, the part of the swing angle of the pick 62 that corresponds to a time period from a time point when the light-receiving element 68B is turned off (start of shutoff) in accordance with the position of an edge of the wafer W to a time point when the pick 62 stops moving is detected and stored in the storage section 78 as an angular reference value $\theta 0$. FIG. 9, (B), shows an output pattern obtained when a product wafer W to be processed is actually transferred, which provides an angular detection value $\theta 1$.

FIG. 10, (A), shows a case where the pick 62 is swung in a direction indicated by the arrow A2 in FIG. 8A, from the standby position shown with the solid line to the position shown with the chain line. At this time, the part of the swing angle of the pick 62 that corresponds to a time period from a time point when the pick 62 starts moving to a time point when the light-receiving element 68B is turned on in accordance with the position of an edge of the wafer W is detected and stored in the storage section 78 as an angular reference value $\theta 0$ (the same as $\theta 0$ in FIG. 9, (A)). FIG. 10, (B), shows an output pattern obtained when a product wafer W to be processed is actually transferred, which provides an angular detection value $\theta 1$.

When a product wafer W is actually transferred, the difference $\Delta\theta$ between the angular reference value $\theta 0$ and angular detection value $\theta 1$ stands for an angular misalignment amount in the angular direction. In the teaching operation, it suffices if the operation in one of the directions of the arrows A1 and A2 is performed, but the operations in both of the directions may be performed for confirmation.

The angular misalignment amount $\Delta\theta$ may be calculated by the following formula (1).

$$\Delta\theta = \theta 1 - \theta 0 + \alpha(R0 - R1) \quad (1)$$

In the formula (1), R0 denotes the reference value of the radius (the radius of a wafer W used for the teaching operation), R1 denotes the detection value of the radius (the radius of a product wafer W), and $\alpha$ denotes a conversion coefficient from the radius to the swing angle. Of these, R0 and R1 are obtained by the orientor 36 (see FIG. 1) with high accuracy. The conversion coefficient $\alpha$ represents the relationship between the dimension of the radius and the corresponding swing angle, which can be preset on the basis of the swing radius of the transfer arm 60. The term of "$\alpha$ (R0−R1)" described above makes correction for fluctuation in the radius (diameter) of wafers W due to individual difference.

FIG. 11, (A), shows a case where the pick 62 is linearly moved in a direction indicated by the arrow B1 in FIG. 8B, from the standby position shown with a solid line to a position shown with a chain line. At this time, communication and shutoff of the checkout light 69 (see FIG. 6) from the light-emitting element 68B to the light-receiving element 68B are switched by the wafer W supported on the pick 62 with high positional accuracy for the teaching operation, the pick 62, and a gap 84 between them. Based on this, the part of the rectilinear distance of the pick 62 that corresponds to a time period from a time point when the pick 62 starts moving to a time point when the light-receiving element 68B is turned on in accordance with the position of an edge of the wafer W is detected and stored in the storage section 78 as a rectilinear reference value L0. FIG. 11, (B), shows an output pattern obtained when a product wafer W to be processed is actually transferred, which provides a rectilinear detection value L1.

FIG. 12, (A), shows a case where the pick 62 is linearly moved in a direction indicated by the arrow B2 in FIG. 8B, from the position shown with the chain line to the standby position shown with the solid line. At this time, the part of the rectilinear distance of the pick 62 that corresponds to a time period from a time point when the light-receiving element 68B is turned off (start of shutoff) in accordance with the position of an edge of the wafer W to a time point when the pick 62 stops moving is detected and stored in the storage section 78 as a rectilinear reference value L0 (the same as L0 in FIG. 11, (A)). FIG. 12, (B), shows an output pattern obtained when a product wafer W to be processed is actually transferred, which provides a rectilinear detection value L1.

When a product wafer W is actually transferred, the difference $\Delta L$ between the rectilinear reference value L0 and rectilinear detection value L1 stands for a rectilinear misalignment amount in the rectilinear direction. In the teaching operation, it suffices if the operation in one of the directions of the arrows B1 and B2 is performed, but the operations in both of the directions may be performed for confirmation.

The rectilinear misalignment amount $\Delta L$ may be calculated by the following formula (2).

$$\Delta L = L1 - L0 + (R0 - R1) \quad (2)$$

In the formula (2), R0 denotes the reference value of the radius (the radius of a wafer W used for the teaching operation), and R1 denotes the detection value of the radius (the radius of a product wafer W). R0 and R1 are obtained by the orientor 36 (see FIG. 1) with high accuracy. The term of "(R0−R1)" described above makes correction for fluctuation in the radius (diameter) of wafers W due to individual difference.

Next, a brief explanation will be given of a transfer flow when a wafer W (product wafer W) is actually transferred and subjected to a predetermined process.

As shown in FIG. 1, wafer cassettes 26A to 26D are placed on the cassette tables 24 of the cassette stage 18. A wafer W is taken out from one of the wafer cassettes 26A to 26D by one of the transfer arms 80 of the second transfer unit 20, and is transferred to the alignment unit or orientor 36 disposed at one end of the loader transfer chamber 22. Then, the orientor 36 is operated to detect a positional misalignment amount of the center of the wafer W, the direction of the notch or orientation flat, and the radius R1 of the wafer W. When the wafer W is picked up again by the transfer arm 80, control is performed to compensate for the positional misalignment amount and to direct the notch or orientation flat to a predetermined direction. The value of the radius R1 thus detected is stored in the storage section 78 (see FIG. 5) as a detection value of the radius of wafer W, which is used for controlling an operation of the first transfer unit 16.

Then, the wafer W is transferred by the transfer arm 80 into one of the load-lock chambers 38A and 38B, e.g., the load-lock chamber 38A. Then, the wafer W is transferred from the load-lock chamber 38A to the common transfer chamber 8 by one of the transfer arms 60 of the first transfer unit 16 disposed in the common transfer chamber 8. Then, the wafer W is transferred by the transfer arm 60 and loaded into predetermined one of the four process chambers 12A to 12D, in which the wafer W is subjected to a predetermined process. After the wafer W is subjected to a predetermined single process or a plurality of sequential processes, the wafer W is returned through one of the load-lock chambers into one of the wafer cassettes via a route reverse to that described above.

Figure 13:
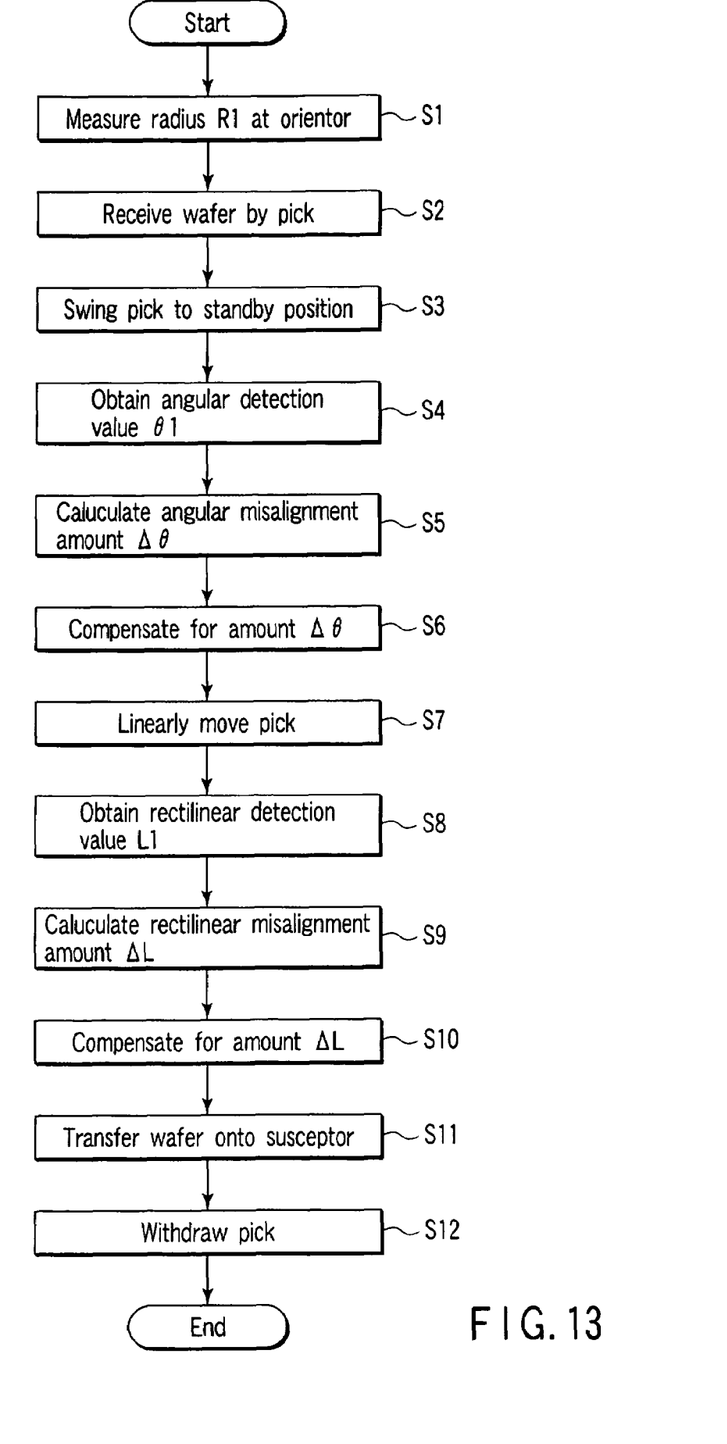
FIG. 13 is a flow chart showing steps of a method for transferring a target object while compensating for a misalignment amount of the center of the target object.

Next, with reference to FIG. 13 as well, an explanation will be given of an operation of the first transfer unit 16 to transfer a wafer W while correcting (compensating for) positional misalignment of the center of the wafer W. FIG. 13 is a flow chart showing steps of a method for transferring a wafer W while compensating for a misalignment amount of the center of the wafer W.

At first, as described above, at the orientor 36, the radius R1 of a wafer W is measured (step S1). Then, the wafer W is transferred to the common transfer chamber 8, and is received by the pick of one of the transfer arms 60 of the first transfer unit 16 (step S2). Then, the pick 62 that supports the wafer W is swung to and stopped at a standby position in front of a predetermined process chamber, e.g., the process chamber 12A (step S3). During this swing movement, the optical sensor 68 is operated, and the light-receiving element 68B (see FIG. 5) disposed at the standby position for the process chamber 12A provides an output, as shown in FIG. 9, (B). Specifically, during this swing movement, the checkout light 69 is detected at first, and the light-receiving element 68B is thereby in the ON-state. However, the checkout light 69 is then shut off by the wafer W (see FIG. 8A), so the checkout light 69 is not detected and the light-receiving element 68B thereby comes into the OFF-state. The output detecting section 72 receives the output of the light-receiving element 68B, and measures an angular detection value θ1 at this time (step S4).

Then, the arithmetic section 74 calculates an angular misalignment amount Δθ, using the formula (1) described above, [Δθ=θ1−θ0+α(R0−R1)], (step S5). The formula (1) includes the term of "α(R0−R1)" to compensate for individual difference in the radius of wafers W. Accordingly, Δθ in the formula (1) differs from Δθ in FIGS. 9 and 10 by α(R0−R1).

Then, on the basis of the angular misalignment amount αθ thus obtained, the arm controller 76 is operated to perform correction in the angular direction (step S6). In other words, the transfer arm 60 is slightly swung to compensate for the angular misalignment amount αθ.

Then, the pick 62 that supports the wafer W is linearly moved into and stopped in the process chamber 14A by extending the transfer arm 60 (step S7). During this rectilinear movement, the light-receiving element 68B (see FIG. 5) provides an output, as shown in FIG. 11, (B). Specifically, during this rectilinear movement, the checkout light 69 can pass through only the gap 84 (see FIG. 8B) between the proximal portion of the pick 62 and an edge of the wafer W, and the light-receiving element 68B thereby comes into the ON-state pulse-wise. The output detecting section 72 receives the output of the light-receiving element 68B, and measures a rectilinear detection value L1 at this time (step S8).

Then, the arithmetic section 74 calculates a rectilinear misalignment amount ΔL, using the formula (2) described above, [ΔL=L1−L0+(R0−R1)], (step S9). The formula (2) includes the term of "(R0−R1)" to compensate for individual difference in the radius of wafers W. Accordingly, ΔL in the formula (2) differs from ΔL in FIGS. 11 and 12 by (R0−R1).

Then, on the basis of the rectilinear misalignment amount ΔL thus obtained, the arm controller 76 is operated to perform correction in the rectilinear direction (step S10). In other words, the transfer arm 60 is slightly and linearly moved to compensate for the rectilinear misalignment amount ΔL.

Then, the wafer W is delivered onto the susceptor 14A (destination) inside the process chamber 12A (step S11). At this time, the wafer W is placed on the susceptor 14A with high accuracy, because the transfer arm 60 has been adjusted to compensate for the angular misalignment amount Δθ and rectilinear misalignment amount ΔL of the wafer W on the pick 62. Then, the transfer arm 60 is retracted to withdraw the pick 62 and the transfer arm 60 out of the process chamber 12A (step S12), thereby completing the transfer operation.

When the wafer W is unloaded from the process chamber, an operation is performed reversely to that described above. In this case, the light-receiving element 68B provides an output pattern, as shown in FIGS. 10 and 12, for example. The correction operations of the transfer arm 60 are performed every time a wafer W is transferred into each of the process chambers 12A to 12D and load-lock chambers 38A and 38B to compensate for positional misalignment. It may be arranged such that the correction operation of the step S6 in the angular direction is performed simultaneously with the correction operation of the step S10 in the rectilinear direction.

The optical sensor 68 is also used as an interlock information source for interlocking the opening/closing of a gate valve with the presence/absence of a wafer W on the pick 62. For example, if the output of the optical sensor 68 indicates "absence" when a wafer W should be present on the pick 62, or if the output of the optical sensor 68 indicates "presence" when a wafer W should be absent on the pick 62, the arm controller 76 stops the operation of the transfer arm 60. Further, at this time, under the control of the main control section 46, the opening/closing operation of the corresponding gate valve is stopped to make the wafer W and processing system in safety.

According to this embodiment, a positional misalignment amount of a wafer W on the pick can be detected without being affected by fluctuation in the diameter of wafers W due to individual difference. Consequently, it is possible to maintain high throughput, and to accurately transfer the wafer W to a destination without positional misalignment.

In the embodiment described above, the processing system is of the cluster tool type, but it may be of another type. The light-emitting element 68A and/or light-receiving element 68B of the optical sensor 68 may be disposed inside the common transfer chamber 8, if this causes no problems, such as contamination of wafers W. In this case, the windows 72 and 76 are unnecessary. In the embodiment described above, the target object is exemplified by a semiconductor wafer, but the target object may be another substrate, such as a glass substrate, LCD substrate, or ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transfer mechanism for transferring a target object having a mainly circular contour, the mechanism comprising:
   a transfer unit including a pick at a distal end for supporting the target object, and configured to supply movements to the pick in an angular direction and a rectilinear direction;

an optical sensor disposed at a standby position on a route of the target object toward a destination, and configured to optically detect presence/absence of the target object on the pick;

an output detecting section configured to detect a signal output from the optical sensor, when the pick supporting the target object is supplied with movements in the angular direction and the rectilinear direction at the standby position;

an arithmetic section configured to calculate an angular misalignment amount $\Delta\theta$ of the target object in the angular direction and a rectilinear misalignment amount of the target object in the rectilinear direction, with reference to a detection value of the signal obtained by the output detecting section, a reference value of the signal, and at least one of a detection value and a reference value of a radius of the target object based on the mainly circular contour; and a controller configured to control the transfer unit to compensate for the angular misalignment amount $\Delta\theta$ and the rectilinear misalignment amount, when the pick is operated to transfer the target object to the destination, wherein the signal includes first and second signals output from the optical sensor when the pick supporting the target object is moved in the angular direction and the rectilinear direction, respectively, and the arithmetic section is configured to calculate the angular misalignment amount $\Delta\theta$ with reference to both of the detection value and the reference value of the radius using formula (1), $$\Delta\theta = \theta 1 - \theta 0 + \alpha(R0 - R1) \qquad (1)$$

where $\theta 1$ denotes the detection value of the first signal, $\theta 0$ denotes the reference value of the first signal, R0 denotes the reference value of the radius, R1 denotes the detection value of the radius, and $\alpha$ denotes a conversion coefficient from the radius to a swing angle.

2. The mechanism according to claim 1, wherein the detection value of the radius is prepared with reference to a signal obtained by an alignment unit configured to optically detect an edge of the target object.

3. The mechanism according to claim 1, further comprising a storage section configured to store the reference value of the signal and at least one of the detection value and the reference value of the radius.

4. The mechanism according to claim 1, wherein the reference value of the signal comprises reference values of the first and second signals, which are preset by a teaching operation performed on the transfer unit and using a reference target object.

5. The mechanism according to claim 4, wherein the reference value of the radius is a radius of the reference target object.

6. A semiconductor processing system for processing a target object having a mainly circular contour, the system comprising:

a pressure-adjustable common transfer chamber having a plurality of side surfaces;

pressure-adjustable first and second process chambers connected to two of the plurality of side surfaces and each configured to perform a semiconductor process on a target object;

a transfer unit disposed inside the common transfer chamber to transfer the target object into and from the first and second process chambers, the transfer unit including a pick at a distal end for supporting the target object, and configured to supply movements to the pick in an angular direction and a rectilinear direction;

an optical sensor disposed at a standby position, which is preset inside the common transfer process chamber and in front of each of the first and second process chambers, and configured to optically detect presence/absence of the target object on the pick;

an output detecting section configured to detect a signal output from the optical sensor, when the pick supporting the target object is supplied with movements in the angular direction and the rectilinear direction at the standby position;

an arithmetic section configured to calculate an angular misalignment amount $\Delta\theta$ of the target object in the angular direction and a rectilinear misalignment amount of the target object in the rectilinear direction, with reference to a detection value of the signal obtained by the output detecting section, a reference value of the signal, and at least one of a detection value and a reference value of a radius of the target object based on the mainly circular contour; and a controller configured to control the transfer unit to compensate for the angular misalignment amount $\Delta\theta$ and the rectilinear misalignment amount, when the pick is operated to transfer the target object to a corresponding one of the first and second process chambers, wherein the signal includes first and second signals output from the optical sensor when the pick supporting the target object is moved in the angular direction and the rectilinear direction, respectively, and the arithmetic section is configured to calculate the angular misalignment amount $\Delta\theta$ with reference to both of the detection value and the reference value of the radius using formula (1).

$$\Delta\theta = \theta - \theta 0 + \alpha(R0 - R1) \qquad (1)$$

where $\theta 1$ denotes the detection value of the first signal, $\theta 0$ denotes the reference value of the first signal. R0 denotes the reference value of the radius, R1 denotes the detection value of the radius, and $\alpha$ denotes a conversion coefficient from the radius to a swing angle.

7. The system according to claim 6, further comprising an alignment unit directly and indirectly connected to the common transfer chamber and configured to optically detect an edge of the target object, wherein the detection value of the radius is prepared with reference to a signal obtained by the alignment unit.

8. The system according to claim 6, further comprising a storage section configured to store the reference value of the signal and at least one of the detection value and the reference value of the radius.

9. The system according to claim 6, wherein the reference value of the signal comprises reference values of the first and second signals, which are preset by a teaching operation performed on the transfer unit and using a reference target object.

10. The system according to claim 9, wherein the reference value of the radius is a radius of the reference target object.

11. A transfer mechanism for transferring a target object having a mainly circular contour, the mechanism comprising:

a transfer unit including a pick at a distal end configured to support the target object, and configured to move the pick in an angular direction and a rectilinear direction;

an optical sensor disposed at a standby position on a route of the target object toward a destination, and configured to optically detect a presence or absence of the target object on the pick;

an output detecting section configured to detect a signal output from the optical sensor when the pick supporting the target object is moved in the angular direction and the rectilinear direction at the standby position;

an arithmetic section configured to calculate an angular misalignment amount of the target object in the angular direction and a rectilinear misalignment amount $\Delta L$ of the target object in the rectilinear direction with reference to a detection value of a signal obtained by the output detecting section, a reference value of the signal, and at least one of a detection value and a reference value of a radius of the target object based on the mainly circular contour; and a controller configured to control the transfer unit to compensate for the angular misalignment amount and the rectilinear misalignment amount $\Delta L$ when the pick is operated to transfer the target object to the destination, wherein the signal includes first and second signals output from the optical sensor when the pick supporting the target object is moved in the angular direction and the rectilinear direction, respectively, and the arithmetic section is configured to calculate the rectilinear misalignment amount $\Delta L$ with reference to both of the detection value and the reference value of the radius using formula (2), $$\Delta L = L1 - L0 + (R0 - R1) \qquad (2)$$

where L1 denotes the detection value of the second signal, L0 denotes the reference value of the second signal, R0 denotes the reference value of the radius, and R1 denotes the detection value of the radius.

12. The mechanism according the claim 11, wherein the detection value of the radius is determined with reference to a signal obtained by an alignment unit configured to optically detect an edge of the target object.

13. The mechanism according to claim 11, further comprising a storage section configured to store the reference value of the signal and at least one of the detection value and the reference value of the radius.

14. The mechanism according to claim 11, wherein the reference value of the signal comprises reference values of the first and second signals, the reference values of the first and second signals are preset by a teaching operation performed on the transfer unit and using a reference target object.

15. The mechanism according to claim 14, wherein the reference value of the radius is a radius of the reference target object.

16. A semiconductor processing system for processing a target object having a mainly circular contour, the system comprising:

a pressure-adjustable common transfer chamber including a plurality of side surfaces;

pressure-adjustable first and second process chambers connected to two of the plurality of side surfaces and each configured to perform a semiconductor process on a target object;

a transfer unit disposed inside the common transfer chamber and configured to transfer the target object into and from the first and second process chambers, the transfer unit including a pick at a distal end configured to support the target object, and configured to move the pick in an angular direction and a rectilinear direction;

an optical sensor disposed at a standby position which is preset inside the common transfer process chamber and in front of each of the first and second process chambers, and configured to optically detect a presence or absence of the target object on the pick;

an output detecting section configured to detect a signal output from the optical sensor when the pick supporting the target object is moved in the angular direction and the rectilinear direction at the standby position;

an arithmetic section configured to calculate an angular misalignment amount of the target object in the angular direction and a rectilinear misalignment amount $\Delta L$ of the target object in the rectilinear direction with reference to a detection value of a signal obtained by the output detecting section, a reference value of the signal, and at least one of a detection value and a reference value of a radius of the target object based on the mainly circular contour; and a controller configured to control the transfer unit to compensate for the angular misalignment amount and the rectilinear misalignment amount $\Delta L$ when the pick is operated to transfer the target object to a corresponding one of the first and second process chambers;

wherein the signal includes first and second signals output from the optical sensor when the pick supporting the target object is moved in the angular direction and the rectilinear direction, respectively, and the arithmetic section is configured to calculate the rectilinear misalignment amount $\Delta L$ with reference to both the detection value and the reference value of the radius using formula (2), $$\Delta L = L1 - L0 + (R0 - R1) \qquad (2)$$

wherein L1 denotes the detection value of the second signal, L0 denotes the reference value of the second signal, R0 denotes the reference value of the radius, and R1 denotes the detection value of the radius.

17. The system according the claim 16, further comprising an alignment unit directly and indirectly connected to the common transfer chamber and configured to optically detect an edge of the target object, wherein the detection value of the radius is determined with reference to a signal obtained by the alignment unit.

18. The system according the claim 16, further comprising a storage section configured to store the reference value of the signal and at least one of the detection value and the reference value of the radius.

19. The system according the claim 16, wherein the reference value of the signal comprises reference values of the first and second signals which are preset by a teaching operation performed on the transfer unit and using a reference target object.

20. The system according to claim 19, wherein the reference value of the radius is a radius of the reference target object.

* * * * *